(12) United States Patent
Korniienko et al.

(10) Patent No.: US 8,373,476 B2
(45) Date of Patent: Feb. 12, 2013

(54) DEVICE AND METHOD FOR COMPENSATING A SIGNAL PROPAGATION DELAY

(75) Inventors: Anton Korniienko, Lyons (FR); Eric Colinet, Pasadena, CA (US)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/315,790

(22) Filed: Dec. 9, 2011

(65) Prior Publication Data

US 2012/0146694 A1 Jun. 14, 2012

(30) Foreign Application Priority Data

Dec. 13, 2010 (FR) .................... 10 60427

(51) Int. Cl.
*H03L 7/06* (2006.01)
(52) U.S. Cl. .................. 327/158; 327/149
(58) Field of Classification Search .......... 327/149, 327/158
See application file for complete search history.

(56) References Cited

U.S. PATENT DOCUMENTS

| 4,801,896 | A * | 1/1989 | Phillips et al. ............ 331/25 |
| 5,325,075 | A * | 6/1994 | Rapeli ...................... 332/103 |
| 7,394,325 | B2 * | 7/2008 | Ueno ......................... 331/57 |
| 7,443,250 | B2 * | 10/2008 | Seethamraju et al. ....... 331/17 |
| 7,457,979 | B2 * | 11/2008 | Itahara ..................... 713/500 |
| 7,751,359 | B1 | 7/2010 | Bienn et al. |
| 8,112,654 | B2 * | 2/2012 | Bjerregaard ............... 713/500 |
| 8,175,174 | B2 * | 5/2012 | Ji ............................ 375/259 |
| 2002/0049936 | A1 | 4/2002 | Gutnik et al. |
| 2004/0196867 | A1 * | 10/2004 | Ejzak et al. .............. 370/468 |
| 2005/0129158 | A1 | 6/2005 | Kuwata |
| 2008/0079501 | A1 * | 4/2008 | Hulfachor et al. ......... 331/16 |
| 2011/0310998 | A1 * | 12/2011 | Hu et al. .................. 375/316 |
| 2012/0146694 | A1 * | 6/2012 | Korniienko et al. ........ 327/158 |

FOREIGN PATENT DOCUMENTS

GB 2 129 634 A 5/1984

OTHER PUBLICATIONS

Preliminary Search Report issued Aug. 3, 2011 in FR1060427 FA 745634 (with English translation of Category of Cited Documents).
Hyun-Woo Lee, et al., "A 1.6V 3.3Gb/s GDDR3 DRAM with dual-mode phase and delay-looked loop using power-noise management with unregulated power supply in 54nm CMOS", 2009 IEEE Solid-State Circuits Conference—Digest of Technical Papers, 2009, 3 pages.

(Continued)

*Primary Examiner* — Adam Houston
(74) *Attorney, Agent, or Firm* — Oblon, Spivak, McClelland, Maier & Neustadt, L.L.P.

(57) ABSTRACT

A device for compensating a delay τ suffered by a first periodic signal ref(t) during propagation between a first and second end of a first transmission connection, comprising at least:
first means able to generate a second signal ref(t+τ) corresponding to the first signal ref(t) the phase of which is advanced by a time equal to the delay τ,
second means able to generate, from a third signal ref(t−τ) obtained at the second end of the first transmission connection and corresponding to the first signal ref(t) the phase of which is delayed by the delay τ, and from the second signal ref(t+τ), a fourth signal in phase with the first signal ref(t).

18 Claims, 7 Drawing Sheets

OTHER PUBLICATIONS

François Anceau, "Une Techique de réduction de la puissance dissipée par l'horlogerie des circuits complexes rapides", 4$^{th}$ Francophone Study Days Low Voltage Low Power (FTFC'2003), May 16, 2003, 5 pages (with English abstract).

A. Korniienko, et al., "A clock network of distributed ADPLLs using an asymmetric comparison strategy", (ISCAS), 2010, 4 pages.

Eby G. Friedman, "Clock Distribution Networks in Synchronous Digital Integrated Circuits", Proceedings of the IEEE, May 2001, vol. 89, No. 5, pp. 665-692.

Martin Saint-Laurent, "A Multi-PLL Clock Distribution Architecture for Gigascale Integration", IEEE Computer Society Workshop, VLSI, May 2001, pp. 30-35.

Tadao Saito, "Application of Phase-Locked Oscillator for PCM Network Synchronization", IEEE Transactions on Communications, vol. COM-30, No. 10, Oct. 1982, pp. 2344-2354.

Gill A. Pratt, et al., "Distributed Synchronous Clocking", IEEE Transactions on Parallel and Distributed Systems, vol. 6, No. 3, Mar. 1995, pp. 314-328.

Vadim Gutnik, et al., "Active GHz Clock Network Using Distributed PLLs", IEEE Journal of Solid-State Circuits, vol. 35, No. 11, Nov. 2000, pp. 1553-1560.

Hong-Yean Hsieh, et al., "Self-Calibrating Clock Distribution with Scheduled Skews", Circuits and Systems, ISCAS '98, 1998 IEEE, pp. II-470-II-473.

\* cited by examiner

DEVICE AND METHOD FOR COMPENSATING A SIGNAL PROPAGATION DELAY

TECHNICAL FIELD

The invention concerns a device and method for compensating a signal propagation delay through a transmission link, in particular an electrical link. The invention applies particularly to the field of the generation and synchronisation of distributed clock signals, used for example for synchronising one or more electrical and/or electronic devices such as microprocessors, and/or in the telecommunications field.

PRIOR ART

In a synchronous electrical and/or electronic system, a clock signal defines a time reference serving in particular to make a synchronous propagation of data in the system and a timing of the various elements of the system. A synchronous system on a chip, for example a microprocessor, generally comprises a balanced tree for distributing clock signals enabling clock signals to be distributed from a source to the elements of the system to be timed. Synchronisation of the clock signals generated is obtained by equalising the propagation times of the clock signal coming from the source in each of the branches of the system in which the clock signal is distributed.

For the circuits in multiprocessor systems, it is very complicated, and sometimes impossible, to implement a perfectly balanced tree for distributing clock signals. This balancing is often imprecise and desynchronisation of the clock signals may therefore appear in these circuits. In addition, when an additional element is added to the existing system, for example an additional microprocessor, this may require resizing the whole of the clock signal distribution tree. Finally, a fault in one of the branches of the clock signal distribution tree may easily affect a major part of the parallel system depending on the location of the failure.

Another drawback of such a clock signal distribution tree is the high power consumption thereof, which is dissipated partly in the form of heat. This excessive consumption is caused in particular by the high stray impedance of the wide distribution branches of the tree, causing an increase in the clock signal rise time and therefore in the delay. This consumption becomes even more critical when the tree functions at high frequency.

Moreover, even when the clock signal distribution tree is well designed and balanced, complying with all the branch lengths without failure, there always exist significant sources of imperfections of the "skew" type (phase difference with respect to the nominal value of the clock) and "jitter" (oscillations around the nominal value of the clock) which are related in particular to the use of buffers in the clock signal distribution tree, serving as repeaters of the clock signal, and to crosstalk between the lines. These imperfections are particularly critical for clock signals of high frequency. In addition, because of the increase in the frequencies of the clock signals, it may happen that the clock skew through the chip is comparable to the clock cycle, inevitably causing computing errors.

As an alternative to the conventional clock signal distribution tree, it is possible to use a phase-locked loop (PLL) distributed network with multiple inputs, interconnected, or coupled, with each other, each PLL generating a local clock signal synchronised so as to be active with the other PLLs. In general terms, a PLL is composed of one or more phase comparators (also referred to as phase detectors), a VCO (voltage controlled oscillator) and a corrector controlling the VCO so as to be synchronised with respect to a reference clock signal. It is said that a set of oscillators is synchronised in terms of phase and frequency when each of the oscillators is oscillating on the same frequency with the same phase. The synchronisation is termed active when the measurement of and compensation for the phase difference takes place take in real time, which, at each instant, makes it possible to remedy the problems relating to the influence of all the possible perturbations (temperature, stray impedance, dispersion, aging, failure, etc).

An example of such a PLL distributed network 10 is shown in FIG. 1. This network 10 has nodes 12, each node 12 comprising a VCO, an adder and a corrector supplying to the VCO a control signal defining the oscillation frequency of the VCO. One or more nodes 12 of the distributed network 10 are formed not by a VCO and its associated corrector but by one or more synchronous oscillating sources forming a master clock on which the oscillators formed by the other nodes 12 in the distributed network 10 will be synchronised. The nodes 12 form clock signal generators separated spatially from one another and connected together in the form of a regular two-dimensional grid. Phase comparators, or detectors, 14 posed between the nodes 12 provide the phase error of a VCO with respect to the adjacent VCO. Each VCO of the nodes 12 forms, with the phase comparators 14 that are adjacent thereto, a PLL. The phase errors coming from the nodes (for example 4 in number when a node 12 not situated at one edge of the network 10 is considered) adjacent to each of the nodes 12 are added and filtered within this node and are used to adjust the phase of the VCO of this node in order to make it equal to the mean phase of the adjacent nodes. Thus, when the phase of the clock signal produced at each node 12 is synchronised with the mean phase of the clock signals produced at the adjacent nodes thereof, the whole of the distributed network 10 is deemed to be globally synchronised in frequency and phase.

In this architecture, instead of using wide distribution branches, use is therefore made only of simple electrical lines for interconnection of the adjacent nodes, thus compensating systematically for the propagation times. In addition, by using frequency dividers within each node, it is possible to distribute the clock signal in low frequency while keeping local frequencies (at the nodes) high.

It is however possible that, in such an architecture, a propagation time between two adjacent nodes may arise. In this case, each PLL is synchronised not with the signals actually delivered by the adjacent PLLs, but with delayed signals. Such a delay may then accumulate in the chip through the nodes and in the end prevent the network from synchronising.

In order to attempt to prevent the appearance of such a propagation delay, the document U.S. Pat. No. 7,571,359 proposes to arrange the phase comparators shared between two nodes of adjacent PLLs at equal distances from these two nodes. Thus, as shown in FIG. 2, for a phase comparator 14 disposed between two nodes 12.1 and 12.2 and the output signal of which is sent to these two nodes 12.1 and 12.2, the distances between this phase comparator 14 and each of the nodes 12.1 and 12.2 are therefore chosen as being equal. If the phase comparator 14 is placed exactly at the middle, at equal distances from the nodes 12.1 and 12.2, the two clock signals coming from these nodes 12.1 and 12.2 (represented by the arrows 16.1 and 16.2) are delayed equally, the phase difference between the signals generated by the adjacent PLLs then being auto-compensated for. The same applies to the signals sent from the phase comparator 14 to the nodes 12.1 and 12.2.

In practice, and in particular because of the technological dispersions, the thermal expansion or insufficiency of space when such a distributed PLL network is produced, the phase comparator 14 is never arranged exactly at the middle, between the nodes 12.1 and 12.2. As shown in FIG. 2, there always exists an offset Δd of the actual position of the phase comparator 14 with respect to the theoretical position equidistant from the two nodes 12.1 and 12.2, this offset being able to cause a phase difference ("skew") between the two clock signals generated. In addition, given that the electrical connections between the phase comparator 14 and the nodes 12.1 and 12.2 are physically distinct, a disturbance (for example a variation in temperature, electrical supply, etc) impacts on only one of these electrical connections. Because of this asymmetry, such a disturbance therefore generates a phase difference in the clock signals of these nodes 12.1 and 12.2 applied at the input of the phase comparator 14.

The document of Hong-Yean Hsieh et al, "Self-calibrating clock distribution with scheduled skews", Proc. ISCAS 1998, pp. 470-473, describes a system for compensating the delays in a clock signal distribution tree. For each of the electrical connections in which a clock signal is intended to be distributed, the system performs a measurement of the round-trip propagation time of the clock signal in these electrical connections. Arithmetic computing means then determine, by calculation, the various phase differences to be applied to the signals, the clock signals then being propagated from the source with an appropriate delay in order to compensate for the propagation times caused by the electrical lines of the distribution tree.

Such a system has the major drawback of being complex to implement and requires expensive components (large number of inverting stages, multiplexer, arithmetic and control logic). In addition, this system requires the signals to be distributed at high frequency.

DISCLOSURE OF THE INVENTION

Thus there is a need to propose a device and method for compensating the propagation delay, or time, of one or more signals, such as electrical signals on one or more transmission connections, making it possible to automatically produce a compensation for the propagation time and not requiring complex computing means for implementation thereof.

For this purpose, one embodiment proposes a device for compensating a delay, or time, τ suffered by a first signal ref(t) during propagation between a first and second end of a first transmission connection, comprising at least:
  first means able to generate a second signal ref(t+τ) corresponding to the first signal ref(t) the phase of which is advanced by a time equal to the delay τ,
  second means able to generate, from a third signal ref(t−τ) obtained at the second end of the first transmission connection and corresponding to the first signal ref(t) the phase of which is delayed by the delay τ, and from the second signal ref(t+τ), a fourth signal in phase with the first signal ref(t).

Such a device forms a solution to the problem of the propagation times of clock signals, effecting a compensation for the propagation time in a transmission connection by forming an automatic correction system implemented at the transmission connection.

The first signal ref(t) is a periodic signal.

The device is based on the principle of phase-locked loops (PLLs) and can easily be applied to a clock signal distribution network, for example of the distribution tree or PLL network type. The device can also effect a compensation for the propagation time of a signal in a simple transmission connection. The device will automatically generate a clock signal in phase advance, the value of which is equal to the value of the delay caused by the propagation path formed by the transmission connection. From these two signals, the device can therefore generate at the output a signal in phase and synchronous with the original signal.

The expression "transmission connection" designates any type of connection over which it is possible to transmit a signal. Such a connection will advantageously be an electrical connection, such as for example an electrical wire, an electrical line, a conductive track, etc. However, the invention can also apply to other types of transmission connection: optical, electromagnetic, etc.

The first means able to generate the second signal ref(t+τ) may comprise at least:
  a phase comparator able to compare a phase of the first signal ref(t) and a phase of a signal obtained at a first end of a second transmission connection able to delay, by a delay substantially equal to τ, a signal, such as an electrical signal, propagated on said second transmission connection,
  an voltage-controlled oscillator an output of which, corresponding to an output of said first means, is connected, for example electrically, to a second end of the second transmission connection,
  a third transmission connection able to delay, by a delay substantially equal to τ, a signal, for example an electrical signal, propagated on said third transmission connection, comprising a first end coupled, for example electrically, to an output of the phase comparator and a second end coupled, for example electrically, to an input of the voltage-controlled oscillator.

The phase comparator may comprise a first input coupled, for example electrically, to the first end of the first transmission connection and a second end coupled, for example electrically, to a first end of the second transmission connection.

The first means able to generate the second signal ref(t+τ) may also comprise a low-pass filter, the first end of the third transmission connection being coupled, for example electrically, to the output of the phase comparator at least by means of said low-pass filter or the second end of the third transmission connection being coupled, for example electrically, to the input of the voltage-controlled oscillator at least by means of said low-pass filter.

The first means able to generate the second signal ref(t+τ) may comprise at least:
  a phase comparator able to compare a phase of the first signal ref(t) and a phase of a signal obtained at a first end of a second transmission connection able to delay, by a delay substantially equal to τ, a signal propagated on said second transmission connection,
  a low-pass filter an input of which is connected to the output of the phase comparator,
  a voltage-controlled oscillator an input of which is connected to an output of the low-pass filter,
  a third transmission connection able to delay, by a delay substantially equal to τ, a signal propagated on said third transmission connection, comprising a first end connected to an output of the voltage-controlled oscillator and a second end, corresponding to an output of said first means, connected to a second end of the second transmission connection.

According to a variant embodiment, the first means able to generate the second signal ref(t+τ) may comprise at least:
  a phase comparator able to compare a phase of the first signal ref(t) and a phase of a signal obtained at a first end of a second transmission connection able to delay, by a delay substantially equal to τ, a signal propagated on said second transmission connection, a low-pass filter an input of which is connected to the output of the phase comparator, a voltage-controlled delay line comprising a first input coupled to an output of the low-pass filter and a second input to which the first signal ref(t) is intended to be applied, a third transmission connection able to delay, by a delay substantially equal to τ, a signal propagated on said third transmission connection, interposed between the phase comparator and the low-pass filter, or between the low-pass filter and the voltage controlled delay line, or between the voltage-controlled delay line and the second transmission connection. In this case, when the third transmission connection is interposed between the phase comparator and the low-pass filter or between the low-pass filter and the voltage-controlled delay line, the output of said first means may correspond to the output of the voltage-controlled delay line. On the other hand, when the third transmission connection is interposed between the voltage-controlled delay line and the second transmission connection, the output of said first means may correspond to the end of the third transmission connection that is connected to the end of the second transmission connection.

The second means able to generate the fourth signal may comprise at least one phase-locked loop able to generate the fourth signal as an output.

In this case, the phase-locked loop may comprise at least:

a first phase comparator able to compare a phase of the third signal ref(t−τ) obtained at the second end of the first transmission connection and a phase of the fourth signal obtained at the output of the phase-locked loop, a second phase comparator able to compare a phase of the second signal ref(t+τ) obtained at the output of said first means and a phase of the fourth signal obtained at the output of the phase-locked loop, means of adding signals obtained at the output of the first and second phase comparators, an attenuator for the signal obtained at the output of the addition means, with a gain of approximately 0.5, a low-pass filter able to filter the signal obtained at the output of the addition means, a voltage-controlled oscillator comprising an input connected, for example electrically, to an output of the low-pass filter and an output corresponding to the output of the phase-locked loop and coupled, for example electrically, to an input of the first phase comparator and to an input of the second phase comparator.

In a first configuration, the output of the addition means may be connected to the input of the attenuator, and the output of the attenuator may be connected to the input of the low-pass filter. In a second configuration, the output of the addition means may be connected to the input of the low-pass filter. In this case, it is possible for the low-pass filter also to form, that is to say to fulfil the role of, the attenuator, the static gain of the low-pass filter being able to incorporate the attenuation gain.

The output of the voltage-controlled oscillator of the phase-locked loop may be directly connected to said inputs of the first and second phase comparators.

In a variant, the phase-locked loop may also comprise a frequency divider, an input of which may be connected, for example electrically, to the output of the voltage-controlled oscillator and an output of which may be connected, for example electrically, to said inputs of the first and second phase comparators, the first and second phase comparators being in this case respectively able to compare a phase of the third signal ref(t−τ) and a phase of the second signal ref(t+τ) with a phase of the signal obtained at the output of the frequency divider.

The second means able to generate the fourth signal may comprise at least one delay-locked loop able to generate the fourth signal as an output.

In general terms, a delay-locked loop (DLL) may comprises a phase comparator, a voltage-controlled delay line (VCDL) and a corrector controlling the VCDL in order to be synchronised with respect to a reference signal.

The delay-locked loop may comprise at least:

a first phase comparator able to compare a phase of the third signal ref(t−τ) obtained at the second end of the first transmission connection and a phase of the fourth signal obtained at the output of the delay-locked loop, a second phase comparator able to compare a phase of the second signal ref(t+τ) obtained at the output of said first means and a phase of the fourth signal obtained at the output of the delay-locked loop, means of adding signals obtained at the output of the first and second phase comparators, an attenuator for the signal obtained at the output of the addition means, with a gain equal to approximately 0.5, a low-pass filter able to filter the signal obtained at the output of the addition means, a voltage-controlled delay line comprising a first input connected, for example electrically, to an output of the low-pass filter, a second input to which the second signal ref(t+τ) or the third signal ref(t−τ) is intended to be applied, and an output corresponding to the output of the delay-locked loop and coupled, for example electrically, to an input of the first phase comparator and to an input of the second phase comparator.

The output of the voltage-controlled delay line of the delay-locked loop of the second means may be directly connected to said inputs of the first and second phase comparators.

The device may be able to compensate for n delays $\tau_1$ to $\tau_n$ suffered by n first signals $ref_1(t)$ to $ref_n(t)$ during propagation between the first and second ends of n first transmission connections, n being an integer number greater than or equal to 2, in which the first means able to generate the second signal ref(t+τ), τ being equal to the mean of the n delays $\tau_1$ to $\tau_n$, may comprise:

n phase comparators, each being able to compare a phase of one of the n first signals $ref_1(t)$ to $ref_n(t)$ and a phase of a signal obtained at a first end of a second transmission connection able to delay by a delay substantially equal to τ a signal, such as an electrical signal, propagated on said second transmission connection, n third transmission connections, each being able to delay by one of the delays $\tau_1$ to $\tau_n$ a signal, such as an electrical signal, propagated on said third transmission connection, comprising a first end connected, for example electrically, to an output of one of the n phase comparators and a second end connected, for example electrically, to an input of signal addition means, an attenuator for the signal obtained at the output of the addition means, with a gain equal to approximately 1/n, a low-pass filter able to filter the signal obtained at the output of the addition means;

a voltage-controlled oscillator an input of which is connected, for example electrically, to a output of the low-pass filter and an output of which, corresponding to an output of said first means, is coupled, for example electrically, to a second end of the second transmission connection, said device also comprising at least one phase-locked loop or a delay-locked loop comprising n inputs connected, for example electrically, to the second ends of the n first transmission connections and able to deliver the third signal ref(t−τ).

In a variant, the device may be able to compensate for n delays $\tau_1$ to $\tau_n$ suffered by n first signals $ref_1(t)$ to $ref_n(t)$ during propagation between first and second ends of n first transmission connections, n being an integer number greater than or equal to 2, in which the first means able to generate the second signal ref(t+τ), τ being equal to the mean of the n delays $\tau_1$ to $\tau_n$, may comprise:

- n phase comparators, each being able to compare a phase of one of the n first signals $ref_1(t)$ to $ref_n(t)$ and a phase of a signal obtained at a first end of a second transmission connection able to delay by a delay substantially equal to τ a signal propagated on said second transmission connection,
- n third transmission connections, each being able to delay by one of the delays $\tau_1$ to $\tau_n$ a signal propagated on said third transmission connection, comprising a first end connected to an output of one of the n phase comparators and a second end connected to an input of signal addition means,
- an attenuator for the signal obtained at the output of the addition means, with a gain equal to approximately 1/n,
- a low-pass filter able to filter the signal obtained at the output of the addition means,
- a voltage-controlled delay line comprising a first input connected to an output of the low-pass filter and a second input on which one of the n first signals $ref_1(t)$ to $ref_n(t)$ is intended to be applied, and an output of which, corresponding to an output of said first means, is coupled to a second end of the second transmission connection, said device also comprising at least one phase-locked loop or a delay-locked loop comprising n inputs connected to the second ends of the n first transmission connections and able to deliver the third signal ref(t−τ).

In a variant, the third transmission connections may be replaced by a single third transmission connection disposed between the attenuator and the low-pass filter, or between the low-pass filter and the voltage-controlled oscillator or the voltage-controlled delay line.

There also, in a first configuration, the output of the addition means may be connected to the input of the attenuator, and the output of the attenuator may be connected to the input of the low-pass filter. In a second configuration, the output of the addition means may be connected to the input of the low-pass filter. In this case, it is possible for the low-pass filter also to form, that is to say to fulfil the role of, the attenuator.

Another embodiment concerns a device for distributing at least one clock signal ref(t), comprising several transmission connections on which the clock signal ref(t) or a signal, such as an electrical signal, synchronised with the clock signal ref(t) is intended to be propagated, and a plurality of delay compensation devices coupled to said transmission connections and able to compensate for the propagation times of the signals on said transmission connections. Such a device also makes it possible to distribute the clock signal or signals with low-frequency.

The device may also comprise at least one device for generating a clock signal ref(t).

The device may comprise at least one controlled phase loop able to deliver as an output a clock signal the phase of which is synchronised with respect to an average of phases of several signals delivered by said delay compensation devices.

The device may also comprise at least two delay compensation devices coupled together so that:

- an output of the first means able to generate a second signal of a first of the two delay compensation devices is coupled, for example electrically, to an input of second means able to generate a fourth signal of a second of the two delay compensation devices,
- an output of the first means able to generate a second signal of the second of the two delay compensation devices is coupled, for example electrically, to an input of the second means able to generate a fourth signal of the first of the two delay compensation devices.

The output of the first means able to generate a second signal of a first of the two delay compensation devices may be coupled, for example electrically, to an input of the second means able to generate a fourth signal of a second of the two delay compensation devices by means of a line able to delay a signal by a delay τ. Likewise, an output of the first means able to generate a second signal of the second of the two delay compensation devices may be coupled, for example electrically, to an input of the second means able to generate a fourth signal of the first of the two delay compensation devices by means of a line able to delay a signal by a delay τ.

Another embodiment concerns a method for compensating a delay τ suffered by a first signal ref(t) during propagation between a first and second end of a first transmission connection, comprising at least the steps of:

- generating a second signal ref(t+τ) corresponding to the first signal ref(t) the phase of which is advanced by a time equal to the delay τ,
- generating, from a third signal ref(t−τ) obtained at the second end of the first transmission connection and corresponding to the first signal ref(t) the phase of which is delayed by the delay τ, and from the second signal ref(t+τ), a fourth signal in phase with the first signal ref(t).

BRIEF DESCRIPTION OF THE DRAWINGS

The present invention will be understood better from a reading of the description of example embodiments given purely for indication and in no limitatively, referring to the accompanying drawings, in which.

Identical, similar or equivalent parts in the various figures described below bear the same numerical references so as to facilitate passage from one figure to another.

The different parts shown in the figures are not necessarily shown to a uniform scale, in order to make the figures more legible.

The various possibilities (variants and embodiments) must be understood as not being exclusive of one another and may be combined with one another.

DETAILED DISCLOSURE OF PARTICULAR EMBODIMENTS

Figure 3:
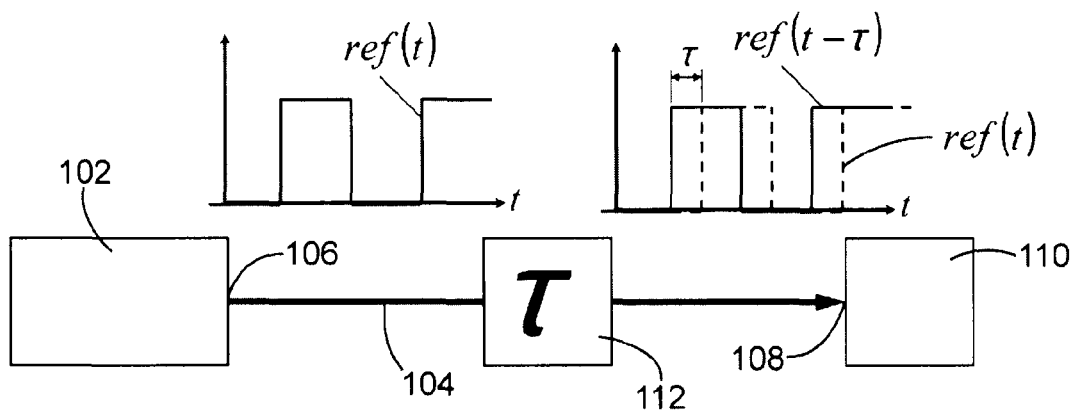
FIG. 3 shows schematically a propagation delay suffered by a signal during propagation of this signal over a transmission connection.

A description is first of all given, in relation to FIG. 3, of the principle of a delay, or retardation, suffered by a signal, here an electrical signal, when this signal is propagated over a transmission connection.

A source 102 generates a periodic signal ref(t) that is sent over a transmission connection 104, here an electrical line, from a first end 106 to a second end 108 of the transmission connection 104. The second end 108 of the transmission connection 104 is connected to an input of a target device 110 intended to receive the periodic signal ref(t), for example in order to be synchronised. The propagation path formed by the transmission connection 104, from the output of the source 102, that is to say from the first end 106 thereof, to the target device 110, that is to say to the second end 108 thereof, causes a delay, or retardation, $\tau$ corresponding to the propagation time of the signal from the first end 106 to the second end 108, this delay being represented symbolically by a delay element 112 disposed on the transmission connection 104. Thus, at any one time, the signal received at the target device 110 corresponds in fact to a signal ref(t−$\tau$) that is to say the signal ref(t) delayed by the delay $\tau$.

Thus, if the target device 110 is a PLL, the latter will then synchronise with respect to the signal ref(t−$\tau$) rather than respect the signal ref(t). The signal obtained at the output of the PLL will therefore also be delayed by a delay equal to $\tau$ with respect to the signal emitted by the source 102.

Figure 4:
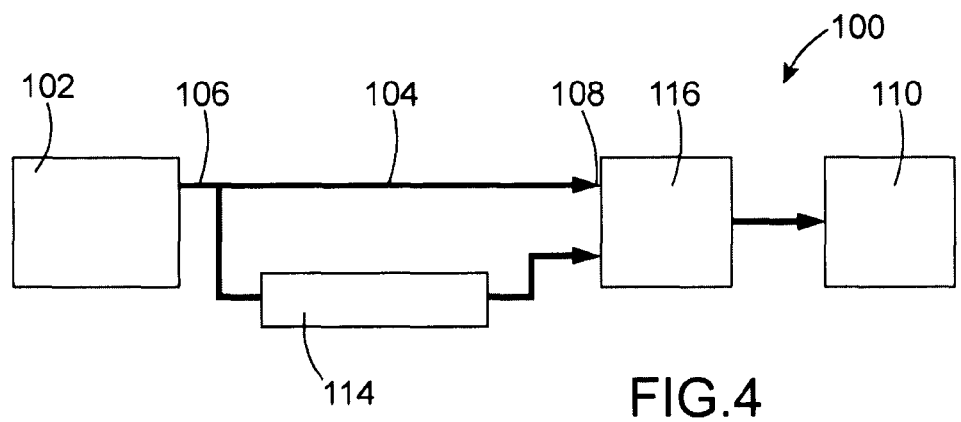
FIG. 4 shows schematically a delay compensation device according to a particular embodiment.

FIG. 4 shows schematically a device 100 for compensating the delay $\tau$ suffered by the signal ref(t), referred to as the first signal, during propagation thereof over the transmission connection 104, referred to as the first transmission connection, between the first end 106 and the second end 108 of the wire 104, that is to say from the source 102 to the target device 110.

The device 100 comprises first means 114 able to generate a second signal ref(t+$\tau$) corresponding to the first signal ref(t) but the phase of which is advanced by a time $\tau$. For this purpose, the first signal ref(t) is applied as an input to the first means 114. The first means 114, the output of which is situated at the second end 108 of the first transmission connection 104, delivers as an output the second signal ref(t+$\tau$). The second end 108 of the first transmission connection 104 is electrically connected to a first input of second means 116, a second input of the second means 116 being electrically connected to the output of the first means 114. From a third signal ref(t−$\tau$) obtained at the second end 108 of the first transmission connection 104 and corresponding to the first signal ref(t) the phase of which is delayed by the delay $\tau$, and from the second signal ref(t+$\tau$) the second means 116 are able to deliver as an output a fourth signal in phase with the first electrical signal ref(t), that is to say a signal synchronised with the first signal ref(t). The electrical signal obtained at the output of the device 100 may be similar to the first electrical signal ref(t), or be synchronised in phase but have a frequency different from that of the first signal ref(t).

Transmission connections connect the input of the first means 114 to the source 102 and to the first end 106 of the first transmission connection 104, the output of the first means 114 to an input of the second means 116, and the output of the second means 116 to the input of the target device 110. Although in theory these transmission connections also cause propagation delays, the lengths of these transmission connections are negligible compared with the length of the first transmission connection 104. Thus the propagation delays suffered by the signals in this transmission connection are negligible compared with the delay $\tau$. Likewise, the propagation delays suffered by the signals within the second means 116 are also negligible compared with $\tau$.

Figure 5:
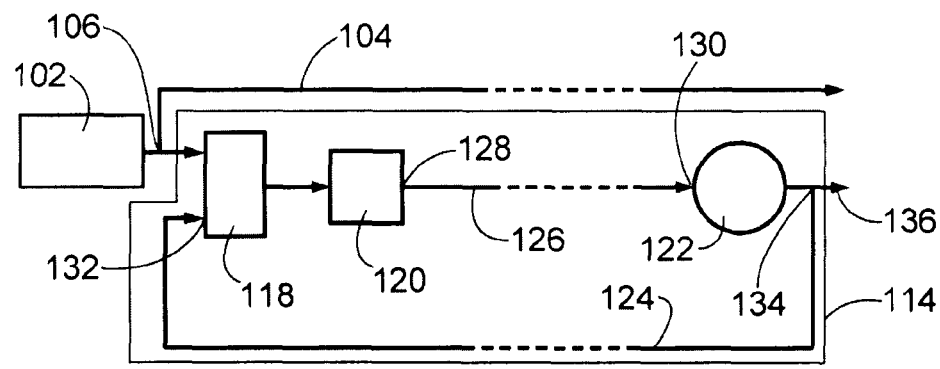
FIG. 5 shows first means able to generate a signal in phase advance of a delay compensation device according to a particular embodiment.

FIG. 5 shows an example embodiment of the first means 114.

In this example embodiment, the first means comprise all the elements of a conventional PLL. Thus the first means 114 comprise a phase comparator or detector 118, a low-pass filter 120 and a voltage-controlled oscillator 122. However, unlike a conventional PLL, the first means 114 also comprise two transmission connections 124 and 126, referred to respectively as second and third transmission connections, able to delay, by a delay substantially equal to $\tau$, a signal propagating over these transmission connections 124 and 126.

The output of the source 102, to which the first end 106 of the first transmission connection 104 is electrically connected, is electrically connected to an input of the first means 114 that corresponds to a first input of the phase comparator 118. The output of the phase comparator 118 is electrically connected to an input of the low-pass filter 120. The output of the low-pass filter 120 is electrically connected to a first end 128 of the first transmission connection 126. A second end 130 of the third transmission connection 126 is electrically connected to an input of the voltage-controlled oscillator 122. The output of the voltage-controlled oscillator 122 corresponds to an output 136 of the first means 114. Finally, a first end 132 of the second transmission connection 124 is electrically connected to a second input of the phase comparator 118, and a second end 134 of the second transmission connection 124 is electrically connected to the output of the voltage-controlled oscillator 122.

Apart from the delays $\tau$ caused by the transmission connections 124 and 126, the propagation delays suffered by the signals in the other transmission connections of the first means 114 are negligible compared with $\tau$.

The second transmission connection 124 makes it possible to delay the phase of the signal delivered by the oscillator 122 by a delay equal to $\tau$. Likewise, the third transmission connection 126 makes it possible to delay the phase of the signal delivered as an output from the filter 120 by a delay equal to $\tau$.

In order to obtain the same propagation delay within the electrical connections or lines 104, 124 and 126, these three transmission connections are arranged alongside one another, have a substantially similar length and are produced from the same material or different materials causing negligible differences in delays. The proximity of these three transmission connections also makes it possible, in the event of disturbance varying the propagation delay, for this variation to be identical on the three transmission lines.

As in a conventional PLL, the elements of the first means 114 form a synchronisation structure. Let div(t) be the signal delivered by the voltage-controlled oscillator 122, corresponding to the signal delivered at the output of the first means 114. Because of the delay τ caused by the second transmission connection 124, the signal applied on the second input of the phase comparator 118 corresponds to the signal div(t−τ). The first means 114 will therefore slave the phase of the signal div(t−τ) with respect to the phase of the signal ref(t). After a transient period, the feedback loop formed by the first means 114 will therefore equalise the two signals applied at the input of the phase comparator 118 such that:

$$ref(t)=div(t-\tau)$$

This amounts to stating that the signal div(t) at the output of the oscillator 122 corresponds to the signal ref(t+τ).

This phase advance is obtained by reason of the periodicity of the signal ref(t):

$$ref(t)=ref(t \pm y \cdot T)$$

with T: period of the signal
y: integer number greater than or equal to 1.
However, a phase advance may always be interpreted as a phase delay by a corresponding value τ'

$$ref(t+\tau)=ref(t+nT-(nT-\tau))=ref(t-(nT-t))=ref(t-\tau')$$

where n∈Z is an integer number sufficiently large so that t'=nT−τ≥0.

Figure 6:
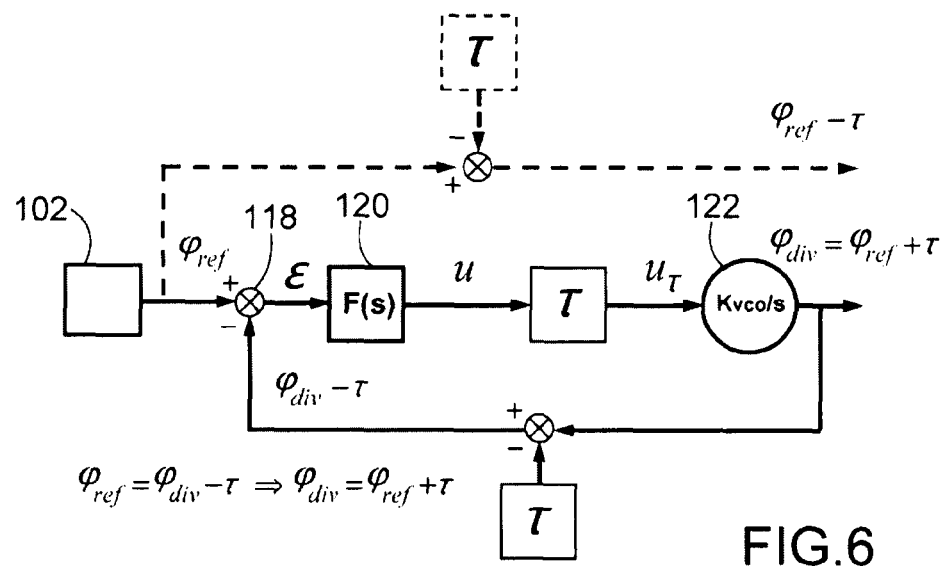
FIG. 6 shows a diagram, in the phase domain, of the synchronisation performed by the first means shown in FIG. 5.

FIG. 6 shows a diagram, in the phase domain, of the synchronisation performed by the first means 114 after stabilisation of the system. In this diagram, only the phases of the signals propagating in the first means 114 are therefore taken into account.

The phase of the signal obtained at the output of the source 102 corresponds to $\phi_{ref}$. From the point of view of the phases, the operation performed by the phase comparator 118 corresponds to a subtraction of the phase of the signal coming from the second transmission connection 124, namely $\phi_{div}-\tau$ from the phase of the signal applied at the input of the first means 114. Thus the output signal ε of the phase comparator 118 is such that:

$$\epsilon=\phi_{ref}-(\phi_{div}-\tau)$$

The low-pass filter 120 is, in the Laplace domain, replaced by its transfer function F(s), such that:

$$u(s)=\epsilon(s) \cdot F(s)$$

The delay caused by the third transmission connection 126 (identical to the first and second transmission connections 104 and 124) corresponds to a pure delay τ such that:

$$u_\tau(s)=u(s) \cdot e^{-\tau s}$$

Finally, the controlled oscillator 122 is, in the Laplace domain, replaced by an integrator of the $K_{vco}/s$ type.

After a transient period, the signal ε will tend towards 0, which amounts to writing:

$$\phi_{ref}=\phi_{div}-\tau \text{ and therefore}$$

$$\phi_{div}=\phi_{ref}+\tau$$

Because of the delays introduced artificially into the closed loop by the second and third transmission connections 124 and 126, the stability of this loop may become critical. The delay introduced by the second transmission connection 124 between the voltage-controlled oscillator 122 and the phase comparator 118, in the phase domain, is a simple constant added to the phase of the signal and therefore does not act on the stability of the linear system thus obtained but acts on the operating point thereof. On the other hand, the delay τ introduced by the third transmission connection 126 between the low-pass filter 120 and the voltage-controlled oscillator 122 is a pure delay ($u_r(s)=u(s) \cdot e^{-\tau s}$ in the Laplace domain) since the control signal u delivered at the output of the low-pass filter 120 is a non-periodic signal. Thus the low-pass filter 120 can be produced such that it guarantees both good stability of the loop and a zero static error (for example of type II PLL, a filter performing the pure integration operation 1/s). Such a filter may have a frequency response corresponding to a straight line having a slope of −20 dB/dec in low frequencies. In analogue, this type of filter may be produced by a capacitor integrating the input signal. In the discrete domain, such a filter may be implemented by an accumulator, the output of which is adjusted to its input with a "+" sign.

In the example described in relation to FIGS. 5 and 6, the low-pass filter 120 is arranged between the phase comparator 118 and the third transmission connection 126. In another configuration, it is possible for the third transmission connection 126 to be arranged between the phase comparator 118 and the low-pass filter 120. The signal obtained at the output of the first means 114 is in this case similar to the one previously described for the case where the low-pass filter 120 is arranged between the phase comparator 118 and the second transmission connection 126. It is also possible for the voltage-controlled oscillator 122 to be arranged between the low-pass filter 120 and the third transmission connection 126, which is then connected to the second transmission connection 124.

In another variant embodiment of the first means 114, the voltage-controlled oscillator 122 may be replaced by a voltage-controlled delay line (VCDL), formed for example from several delay cells connected to one another in series. In this configuration, the delay line may be arranged between the low-pass filter 120 and the third transmission line 126 and receives as an input the signal delivered at the output of the filter 120 as well as the signal delivered by the source 102, that is to say ref(t). According to this variant, given that the phase comparator receives as an input the signal ref(t) and a signal delayed by 2τ (a first delay τ caused by the third transmission connection 126 and a second delay τ caused by the second transmission connection 124), the delay line therefore delivers as an output the signal ref(t) in advance by 2τ, that is to say ref(t+2τ). The signal obtained at the output of the first means 114 therefore corresponds to this signal ref(t+2τ), which is delayed by τ by the third transmission connection 126, that is to say ref(t+τ). When the voltage-controlled oscillator 122 is replaced by the voltage-controlled delay line, it is also possible for the third transmission connection 126 to be arranged not downstream of the delay line but between the delay line and the low-pass filter 120, or between the low-pass filter 120 and the phase comparator 118.

Figure 7A:
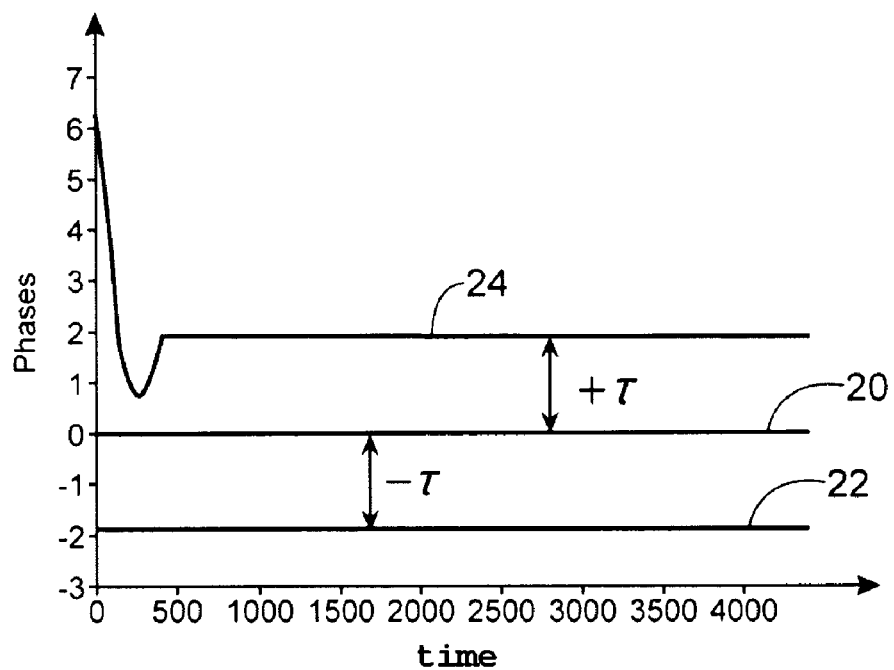
FIGS. 7A and 7B show respectively the phases and signals used in first means able to generate a signal in phase advance of a delay compensation device according to a particular embodiment.

The relative phases (that is to say $\phi_{signal}-\phi_{ref}$) of the signals previously described are shown in FIG. 7A, as a function of the time. The straight line referenced 20 corresponds to the phase $\phi_{ref}$, that is to say the phase of the signal delivered by the source 102 at the input of the first means 114. The straight line referenced 22 corresponds the phase $\phi_{ref}-\tau$, that is to say the phase of the signal obtained at the second end 108 of the first transmission connection 104. Finally, the curve referenced 24 corresponds to the phase of the signal obtained at the output of the first means 114. After a short transient period, it can be seen that this phase stabilises and then has a constant difference equal to +τ with respect to the phase $\phi_{ref}$ of the signal applied at the input of the first means 114.

Figure 7B:
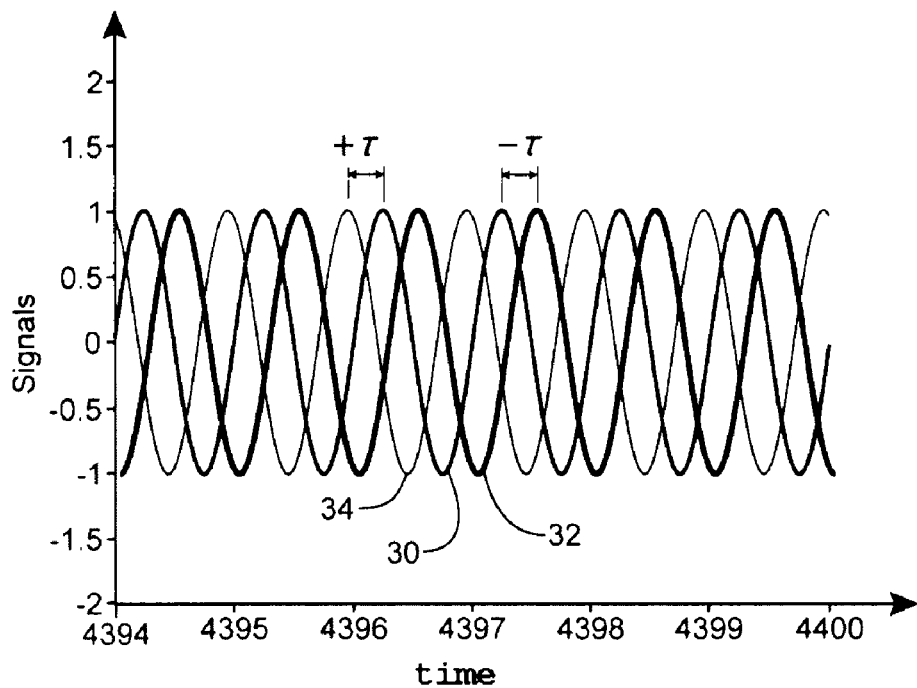

The signals previously described are shown in FIG. 7B. The curves 30, 32 and 34 correspond respectively to the signals ref(t), ref(t−τ) and div(t)=ref(t+τ) obtained after stabilisation of the synchronisation made by the first means 114. It can be seen clearly in this figure that the signal ref(t−τ) has a delay equal to τ with respect to the signal ref(t) and that on the other hand the signal div(t) delivered by the first means 114 has a phase advance equal to τ with respect to the signal ref(t).

From the signals 32 and 34, means 116 are used for performing an operation of addition of phases of these two signals.

Figure 8:
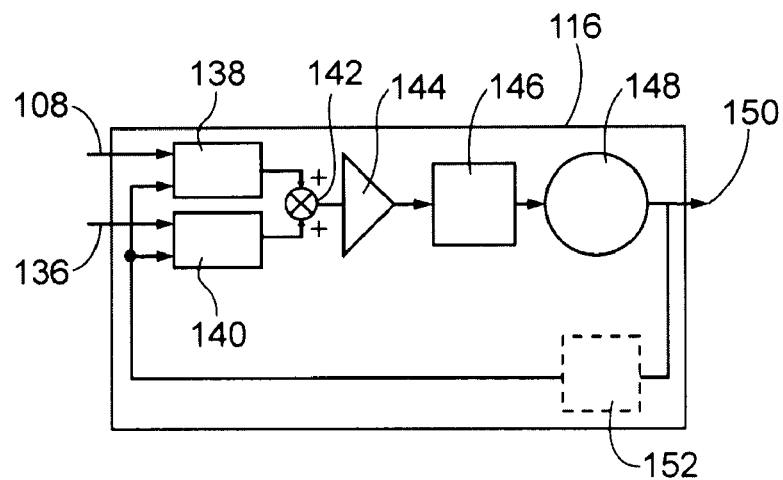
FIGS. 8 and 9 show example embodiments of second means able to generate a signal in phase with the first signal of a delay compensation device according to a particular embodiment.

FIG. 8 shows a first example embodiment of the second means 116 for generating, from the electrical signal ref(t−τ) obtained at the second end 108 of the first transmission connection 102 and the electrical signal ref(t+τ) obtained at the output of the first means 114, an electrical signal similar to the first signal ref(t).

In this first example embodiment, the second means 116 form a two-input PLL. The second end 108 of the first transmission connection 104 is electrically connected to a first of the two inputs corresponding to a first input of a first phase comparator 138, the output 136 of the first means 114 being electrically connected to a second of the two inputs of the PLL corresponding to a first input of a second phase comparator 140.

The outputs of the two phase comparators 138 and 140 are electrically connected to two inputs of an adder 142. The output of the adder 142 is electrically connected to an input of an attenuator 114 with a gain equal to 0.5. Finally, the output of the attenuator 144 is connected to an input of a low-pass filter 146 that is itself connected to a voltage-controlled oscillator 148. The output of the voltage-controlled oscillator 148 corresponds to an output 150 of the second means 116 and is sent to the second inputs of the phase comparators 138 and 140 in order to form the feedback loop of the PLL formed by the second means 116.

The PLL formed by the second means 116 will thus generate on the output 150 a signal that, after a transient period, will be situated, temporally, between the two signals applied to the two inputs of the second means 116, and which will therefore correspond to the signal ref(t).

In a variant embodiment, the second means 116 may comprise a frequency divider 152 (shown in broken lines in FIG. 8) interposed in the feedback loop of the PLL, that is to say between the output of the voltage-controlled oscillator 148 and the second inputs of the phase comparators 138 and 140. This frequency divider 152 may have a division factor equal to N, N being greater than 1, making it possible to reduce by a factor N the signals sent at the input of the phase comparators 138 and 140, and therefore to increase by a factor N the frequency of the signal delivered by the second means 116, which also corresponds to the signal delivered as an output by the device 100, with respect to the original signal ref(t). The device 100 can thus generate a high-frequency clock signal synchronised with respect to the clock signal ref(t), which is in low frequency. The absence of the frequency divider 152 in the PLL formed by the second means 116 is similar to the case where a frequency divider having a division factor N=1 is interposed in the feedback loop of the PLL.

In a variant, and according to the requirements of the application, it could be envisaged having a division factor N such that 0<N<1. Such a case would correspond to replacing the frequency divider 152 with a frequency multiplier that would make it possible to reduce the frequency of the signal delivered at the output 150.

Figure 9:
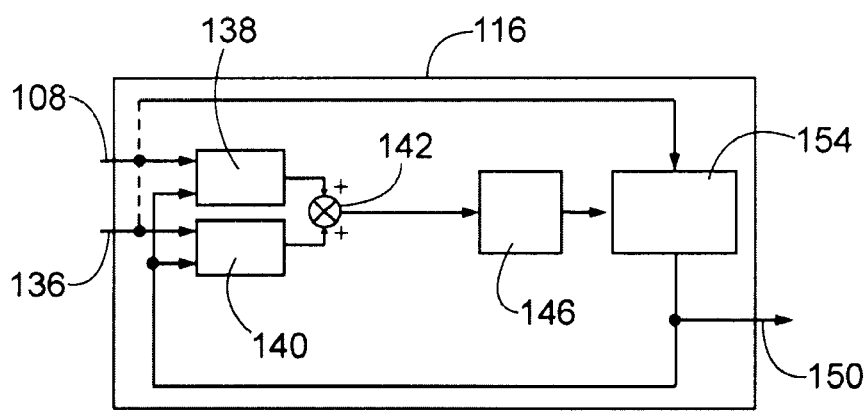

Another example embodiment of the second means 116 is shown in FIG. 9. Compared with the example in FIG. 8, in which the second means 116 form a phase-locked loop (PLL), the second means 116 shown in FIG. 9 form a delay-locked loop (DLL). Compared with the PLL shown in FIG. 8, the voltage-controlled oscillator is here replaced by a voltage-controlled delay line 154 (VCDL), formed for example from several delay cells connected to one another in series. Given that the two signals ref(t−τ) and ref(t+τ) at the input of the DLL have the same frequency after a transient period of the system, one or other of these signals may be applied as an input to the delay line 154 in order to delay or accelerate this signal by a command from the filter, by positioning it, from a temporal point of view, at the middle, between the signals coming from the ends 108 and 136 and applied at the input of the DLL.

In addition, in these second means 116, the gain attenuation equal to approximately 0.5 of the signal delivered as an output of the addition means 142 is produced here directly by the low-pass filter 146, the static gain of which is such that the filter performs this attenuation. The low-pass filter 146 therefore here forms the attenuator of the signal obtained at the output of the addition means 142, with a gain equal to approximately 0.5. This variant, in which the low-pass filter also forms the attenuator, can also be applied to the example previously described in relation to FIG. 8.

Figure 10:
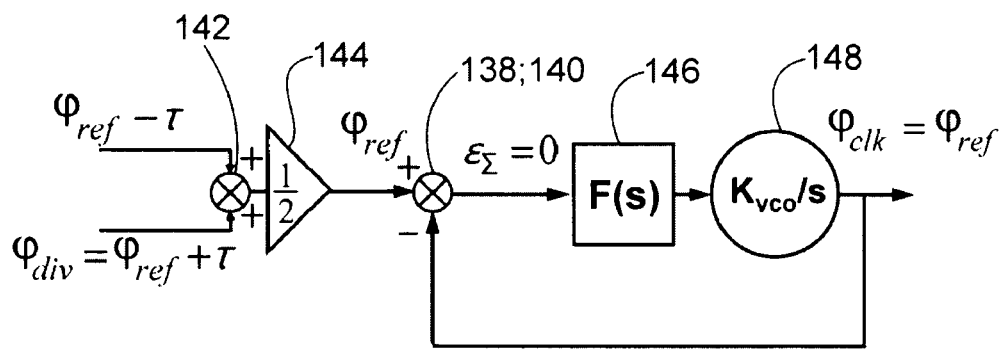
FIG. 10 shows a diagram, in the phase domain, of the synchronisation performed by the second means shown in FIG. 8.

FIG. 10 shows a diagram, in the phase domain, of the synchronisation performed by the second means 116 after stabilisation of the system. In this diagram, only the phases of the signals propagating in the second means 116 are therefore taken into account. On this diagram, it is considered that the second means 116 do not include the frequency divider 152. In addition, for reasons of clarity, the adder 142 and the attenuator 144 are arranged upstream of the phase comparators 138 and 140.

It can be seen in this figure that, from the phase signals $\phi_{ref}-\tau$ and $\phi_{div}=\phi_{ref}+\tau$, an electrical signal with a phase equal to $\phi_{ref}$ is obtained. By calling the signal obtained at the output of the second means 116 clk(t), it can be seen that, at the end of a transient period, the signal clk(t) generated by the PLL formed by the second means 116 will be synchronous with the signal ref(t) so that:

$$clk(t) = ref\left(\frac{2t-\tau+\tau}{2}\right) = ref(t) \Leftrightarrow \varphi_{clk} = \frac{2\varphi_{ref}-\tau+\tau}{2} = \varphi_{ref}$$

Figure 11A:
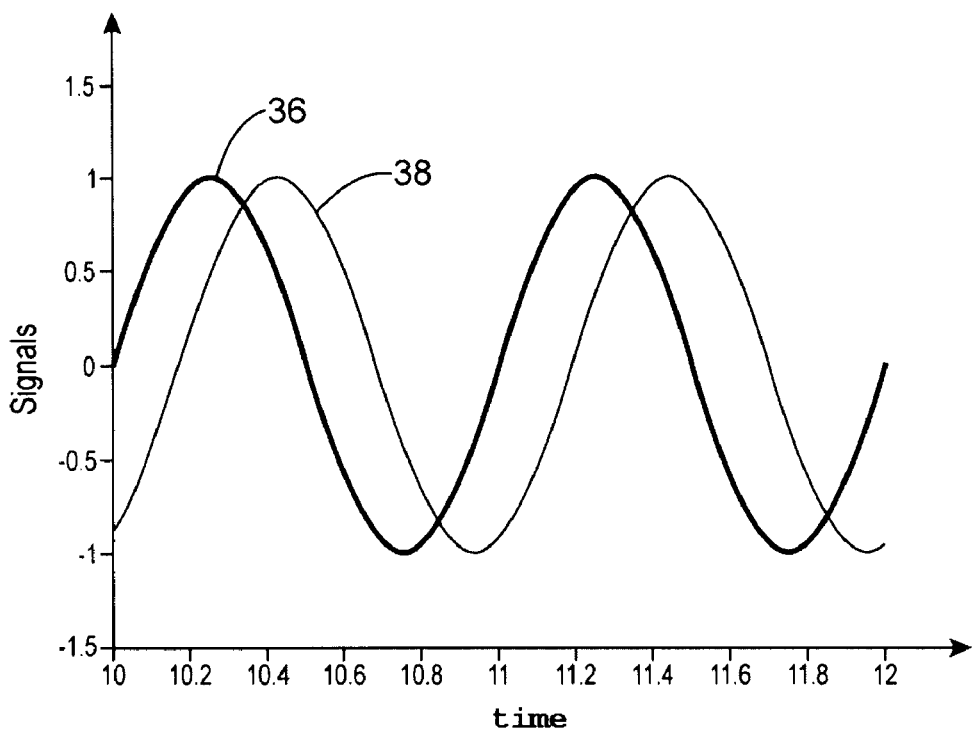
FIGS. 11A and 11B show the signals input to and output from the delay compensation device respectively before and after the synchronisation of phases performed by the device is established (a steady regime after a transient regime)
Figure 11B:
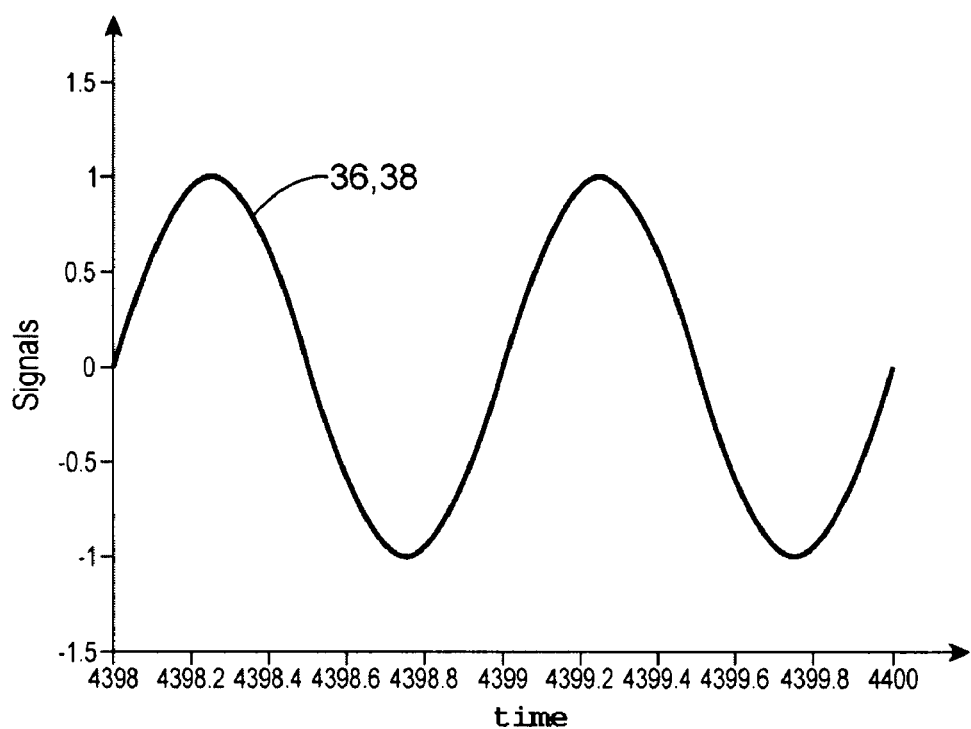

The curves 36 and 38 shown in FIG. 11A correspond respectively to the signals ref(t) and clk(t) when the device 100 is not yet stabilised. It can be seen in this figure that the two signals have a phase difference. Once the synchronisation performed by the device 100 is established, these two signals are then in phase and, when the second means 116 do not include the frequency divider 152, are superimposed as shown in FIG. 11B.

The first and second means 114 and 116 of the delay compensation device 100 may be produced from analogue or digital elements, according to the type of signal to be synchronised and the application envisaged. Digital PLLs (AD-PLLs) comprise digital phase comparators (comparator of the Bang-bang type, converter of the "Time to Digital converter" type, XOR, etc.), digital filters (with finite or infinite pulse response) as well as digital controlled oscillators. Analogue PLLs comprise analogue phase comparators (for example with a charge pump), analogue filters (implemented by capacitors, inductance elements and resistors) and voltage-controlled oscillators.

Figure 12:
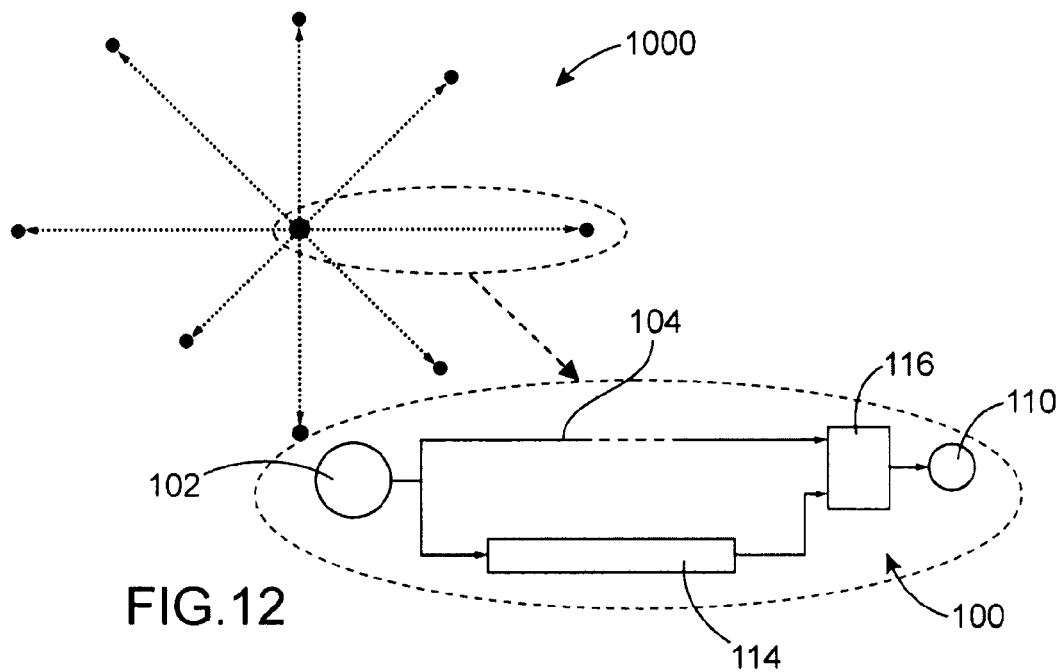
FIGS. 12 to 14 show clock signal distribution devices according to different embodiments.

The delay compensation device 100 may be applied for example to each branch of a clock distribution tree. An example of implementation of such a clock signal distribution device 1000 is shown in FIG. 12. The device 1000 comprises a device for generating a clock signal ref(t), forming the source 102, this signal being intended to be propagated in all the branches of the device 1000. Each branch comprises a transmission connection 104 connected to the source 102, which is therefore common for all the branches of the device 1000. From one branch to another, the lengths of the transmission connections 104 can be different or not. A delay compensation device 100 is coupled to each branch of the device 1000, that is to say to each transmission connection 104. The transmission connections of each delay compensation device 100 are sized according to the transmission connection 104 to which the device 100 is coupled. With such a distribution tree 1000, each target device 110 situated at the ends of the branches of the tree 1000 and intended to received the clock signal ref(t) receives a signal clk(t) delivered by the delay compensation device 100 that is in phase, synchronous and not retarded with respect to the clock signal ref(t) despite the various delays caused by the transmission connections 104.

The signal delivered by the delay compensation device 100 may also be propagated in its turn in various branches coupled to delay compensation devices similar to the device 100, the signal delivered by the device 100 serving in this case as a source clock signal.

Figure 1:
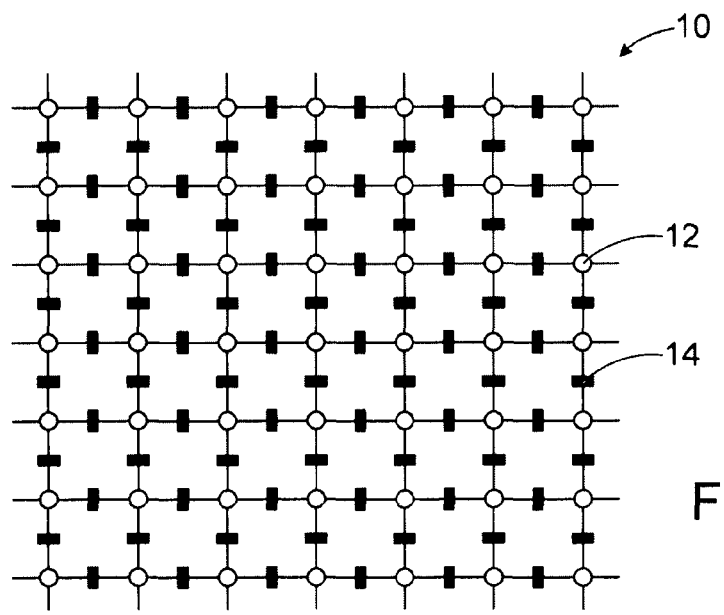
FIG. 1 shows an example of a PLL distributed network forming a clock signal distribution architecture.
Figure 2:
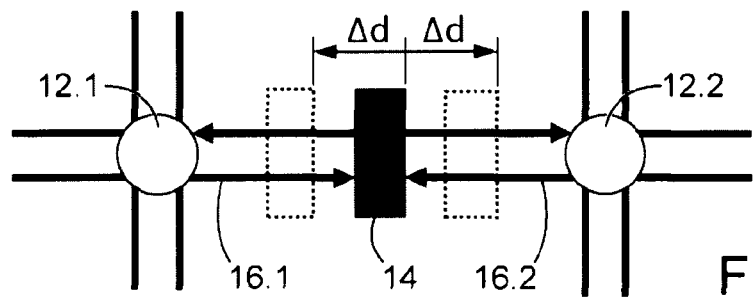
FIG. 2 shows two adjacent PLLs in the PLL distributed network shown in FIG. 1.
Figure 13:
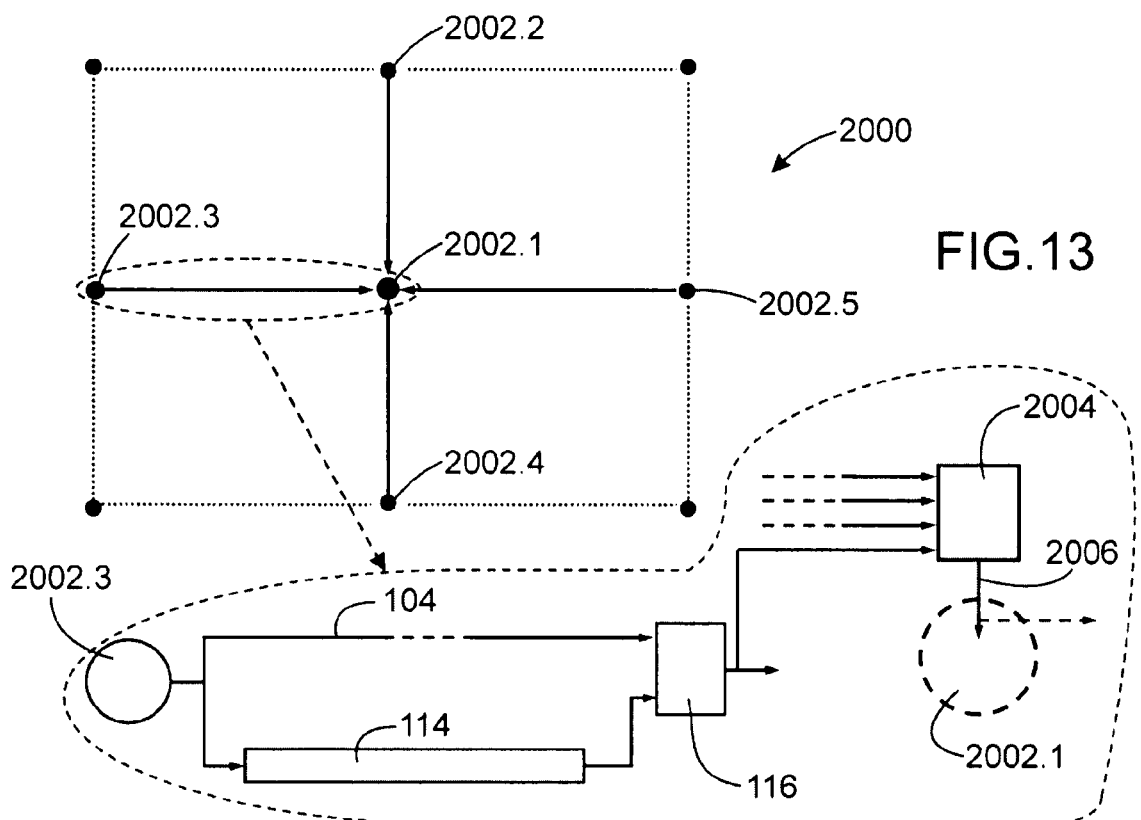

The delay compensation device 100 may also be used in an active clock signal distribution tree, comprising a PLL network as previously described in relation to FIG. 1. An example of such a clock signal distribution device 2000 is shown in FIG. 13. The device 2000 comprises a plurality of nodes 2002 electrically connected to one another in the form of a grid. Thus each node 2002 receives as an input several clock signals coming from the adjacent nodes and is intended to generate a clock signal synchronised with respect to the clock signals received. Each transmission connection between two adjacent nodes 2002 comprises a first transmission connection 104 coupled to a propagation delay compensation device 100 for compensating the propagation delay between these two adjacent nodes 2002. In the example in FIG. 13, the node 2002.1 situated at the centre of the grid is electrically connected to four adjacent nodes 2002.2 to 2002.5 and therefore receives four clock signals as an input. These four clock signals correspond to the signals delivered by the four delay compensation devices 100 coupled to the four transmission connections 104 connected to this central node 2002.1 and are next sent to the input of a controlled phase loop 2004. This controlled phase loop 2004 makes it possible to generate, at an output 2006, at the node 2002.1, a clock signal the phase of which is synchronised with respect to a mean of the phases of the clock signals delivered by the four delay compensation devices 100 connected to the node 2002.1.

Compared with the device 1000 previously described, the device 2000 offers better robustness in particular vis-à-vis any failure of one or more nodes of the device during functioning thereof. For example, if the node 2002.2 no longer delivers any clock signal, the node 2002.1 can all the same synchronise itself with respect to the three remaining nodes 2002.3 to 2002.5.

Figure 14:
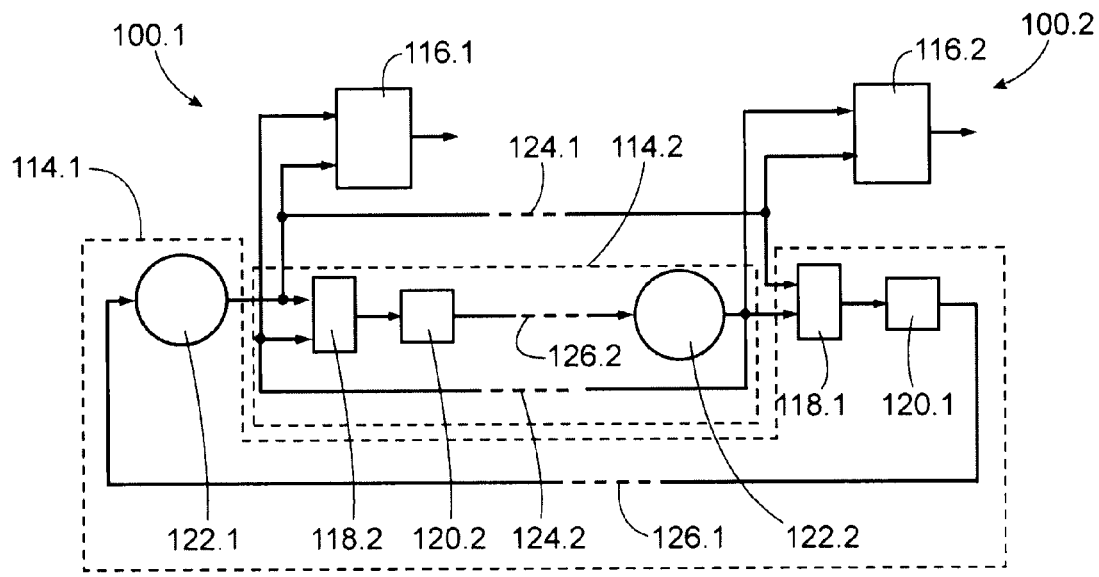

In a variant embodiment of the clock signal distribution device 2000, it is possible for two adjacent nodes 2002 electrically connected together to mutually use the clock signals delivered by each in order to synchronise. In this case, the transmission connection between the two nodes can be implemented by two delay compensation devices 100.1 and 100.2 without requiring the presence of a distinct transmission connection 104 of these two devices. FIG. 14 shows two adjacent nodes produced according to this configuration.

The elements of the two delay compensation devices 100.1 and 100.2 forming the first means 114.1 and 114.2 and the second means 116.1 and 116.2 of these two devices 100.1 and 100.2 are for example similar to those previously described for the delay compensation device 100 in relation to FIGS. 4, 5 and 8 or 9

In addition, an output of the first means 114.1 of the first delay compensation device 100.1 is electrically coupled to an input of the second means 116.2 of the second delay compensation device 100.2. An output of the first means 114.2 of the second delay compensation device 100.2 is electrically coupled to an input of the second means 116.1 of the first delay compensation device 100.1. In this configuration, the second transmission connections 124.1 and 124.2 make it possible to transmit from one node to the other the signals delayed by $\tau$ corresponding to the signal ref(t−$\tau$) previously described. The signal delivered by the voltage-controlled oscillator 122.1 of the first means 114.1 of the first delay compensation device 100.1 is therefore considered by the second means 116.2 of the second delay compensation device 100.2 to be the signal delivered by the source. Likewise, the signal delivered by the voltage-controlled oscillator 122.2 of the first means 114.2 of the second delay compensation device 100.2 is therefore considered by the second means 116.1 of the first delay compensation device 100.1 to be the signal delivered by the source.

This configuration makes it possible to obtain at the output of the second means 116.1 and 116.2 clock signals synchronised in phase and therefore without any phase difference with respect to each other.

In addition, it is also possible for the voltage-controlled oscillator 122.1 to be arranged between the low-pass filter 120.1 and the third transmission connection 126.1, and/or for the voltage-controlled oscillator 122.2 to be arranged between the low-pass filter 120.2 and the third transmission connection 126.2. The voltage-controlled oscillators 122.1 and 122.2 may also be arranged, one or other or both, between the comparator and the low-pass filter of the corresponding first means.

In a variant, the voltage-controlled oscillators 122.1 and 122.2 (one or other or both) may be replaced by voltage-controlled delay lines. In this case, each of the delay lines is arranged between the low-pass filter and the third transmission connection of the corresponding first means 114, or downstream of the third transmission lines as previously described.

Figure 15:
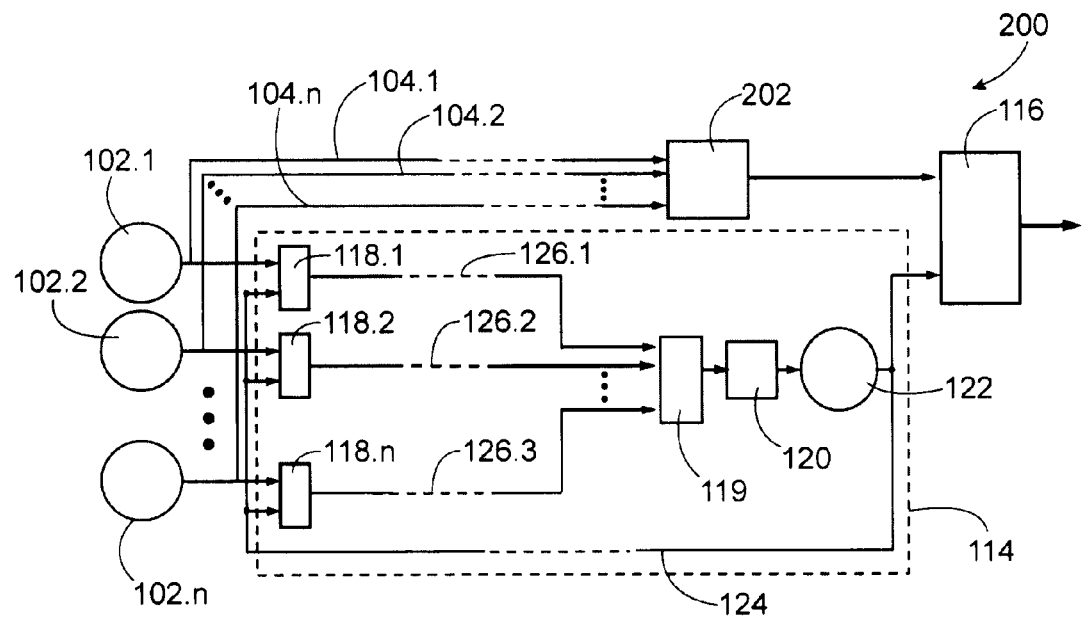
FIG. 15 shows a delay compensation device according to another embodiment.

FIG. 15 shows an example embodiment of a delay compensation device 200 intended to be used in a two- or three-dimensional PLL network and intended to generate a clock signal synchronised in phase with n clock signals $ref_1(t)$ to $ref_n(t)$ delivered by n sources 102.1 to 102.n, and therefore able to compensate for n delays $\tau_1$ to $\tau_n$ suffered by the n signals $ref_1(t)$ to $ref_n(t)$ during propagation on n first transmission connections 104.1 to 104.n, with n an integer number greater than or equal to 2.

The delay compensation device 200 comprises first means 114 able to generate an electrical signal ref(t+$\tau$), $\tau$ being here considered to be the mean of the n delays $\tau_1$ to $\tau_n$.

These first means 114 comprise n phase comparators 118.1 to 118.n, each being able to compare a phase of one of the n first electrical signals $ref_1(t)$ to $ref_n(t)$ and a phase of an electrical signal obtained delivered at the output of these first means and transmitted through a second transmission connection 124 able to delay by a delay substantially equal to τ an electrical signal propagated over this second transmission connection. The signals delivered by the n phase comparators 118.1-118.n are sent over n third transmission connections 126.1-126.n, each being able to delay by a corresponding delay $τ_1$ to $τ_n$ an electrical signal propagated over said third transmission connection, at the input to means 119 forming an adder coupled to an attenuator with a gain equal to 1/n. The result delivered by the attenuator is sent through a low-pass filter 120 and then to the input of a voltage-controlled oscillator delivering a signal ref(t+τ) at the output of the first means 114.

In parallel to this, the n signals $ref_1(t)$ to $ref_n(t)$ propagated through the n first transmission connections 104.1 to 104.n are sent to the input of a phase-locked loop 202 delivering a signal ref(t−τ). As with the delay compensation device 100 previously described, the signals ref(t+τ) and ref(t−τ) are sent as inputs to second means 116, for example similar to those previously described in relation to FIGS. 8 and 9, that is to say having a phase-locked loop or a delay-locked loop, in order to deliver as an output a signal ref(t) synchronous with respect to a mean reference signal the phase of which corresponds to the mean of the phases of the n signals $ref_1(t)$ to $ref_n(t)$.

As with the delay compensation device 100, a frequency divider can be inserted in the return loop of the second means 116 so that the electrical signal delivered by the device 200 has a frequency different from, for example greater than that of the mean reference signal the phase of which corresponds to the means of the phases of the n signals $ref_1(t)$ to $ref_n(t)$. In addition, as previously described, the voltage-controlled oscillator may be replaced by a voltage-controlled delay line. The third transmission connections may also be replaced by a single third transmission connection interposed between the means 119 and the low-pass filter 120, or between the filter 120 and the control oscillator 122 (or the voltage-controlled delay line).

The invention claimed is:

1. A device for compensating a delay τ suffered by a first periodic signal ref(t) during propagation between a first and second end of a first transmission connection, comprising at least:
    first means able to generate a second signal ref(t+τ) corresponding to the first signal ref(t) the phase of which is advanced by a time equal to the delay τ,
    second means able to generate, from a third signal ref(t−τ) obtained at the second end of the first transmission connection and corresponding to the first signal ref(t) the phase of which is delayed by the delay τ, and from the second signal ref(t+τ), a fourth signal in phase with the first signal ref(t).

2. The device according to claim 1, in which the first means able to generate the second signal ref(t+τ) comprise at least:
    a phase comparator able to compare a phase of the first signal ref(t) and a phase of a signal obtained at a first end of a second transmission connection able to delay by a delay substantially equal to τ a signal propagated on said second transmission connection,
    a voltage-controlled oscillator an output of which, corresponding to an output of said first means, is connected to a second end of the second transmission connection,
    a third transmission connection able to delay, by a delay substantially equal to τ, a signal propagated on said third transmission connection, comprising a first end coupled to an output of the phase comparator and a second end coupled to an input of the voltage-controlled oscillator.

3. The device according to claim 2, in which the first means able to generate the second signal ref(t+τ) also comprise a low-pass filter, the first end of the third transmission connection being coupled to the output of the phase comparator at least by means of said low-pass filter or the second end of the third transmission connection being coupled to the input of the voltage-controlled oscillator at least by means of said low-pass filter.

4. The device according to claim 1, in which the first means able to generate the second signal ref(t+τ) comprise at least:
    a phase comparator able to compare a phase of the first signal ref(t) and a phase of a signal obtained at a first end of a second transmission connection able to delay, by a delay substantially equal to τ, a signal propagated on said second transmission connection,
    a low-pass filter an input of which is connected to the output of the phase comparator,
    a voltage-controlled oscillator an input of which is connected to an output of the low-pass filter,
    a third transmission connection able to delay, by a delay substantially equal to τ, a signal propagated on said third transmission connection, comprising a first end connected to an output of the voltage-controlled oscillator and a second end, corresponding to an output of said first means, connected to a second end of the second transmission connection.

5. The device according to claim 1, in which the first means able to generate the second signal ref(t+τ) comprise at least:
    a phase comparator able to compare a phase of the first signal ref(t) and a phase of a signal obtained at a first end of a second transmission connection able to delay, by a delay substantially equal to τ, a signal propagated on said second transmission connection,
    a low-pass filter an input of which is coupled to the output of the phase comparator,
    a voltage-controlled delay line comprising a first input coupled to an output of the low-pass filter and a second input to which the first signal ref(t) is intended to be applied,
    a third transmission connection able to delay, by a delay substantially equal to τ, a signal propagated on said third transmission connection, interposed between the phase comparator and the low-pass filter, or between the low-pass filter and the voltage-controlled delay line, or between the voltage-controlled delay line and the second transmission connection.

6. The device according to claim 1, in which the second means able to generate the fourth signal comprise at least one phase-locked loop able to generate the fourth signal as an output.

7. The device according to claim 6, in which the phase-locked loop comprises at least:
    a first phase comparator able to compare a phase of the third signal ref(t−τ) obtained at the second end of the first transmission connection and a phase of the fourth signal obtained at the output of the phase-locked loop,
    a second phase comparator able to compare a phase of the second signal ref(t+τ) obtained at the output of said first means and a phase of the fourth signal obtained at the output of the phase-locked loop,
    means of adding signals obtained at the output of the first and second phase comparators,
    an attenuator for the signal obtained at the output of the addition means, with a gain of approximately 0.5, a low-pass filter able to filter the signal obtained at the output of the addition means, a voltage-controlled oscillator comprising an input connected to an output of the low-pass filter and an output corresponding to the output of the phase-locked loop and coupled to an input of the first phase comparator and to an input of the second phase comparator.

8. The device according to claim 7, in which the output of the voltage-controlled oscillator of the phase-locked loop is directly connected to said inputs of the first and second phase comparators, or in which the phase-locked loop also comprises a frequency divider an input of which is connected to the output of the voltage-controlled oscillator and an output of which is connected to said inputs of the first and second phase comparators, the first and the second phase comparators being in this case respectively able to compare a phase of the third signal ref(t−τ) and a phase of the second signal ref(t+τ) with a phase of the signal obtained at the output of the frequency divider.

9. The device according to claim 1, in which the second means able to generate the fourth signal comprise at least one delay-locked loop able to generate the fourth signal as an output.

10. The device according to claim 9, in which the delay-locked loop comprises at least:
a first phase comparator able to compare a phase of the third signal ref(t−τ) obtained at the second end of the first transmission connection and a phase of the fourth signal obtained at the output of the delay-locked loop,
a second phase comparator able to compare a phase of the second signal ref(t+τ) obtained at the output of said first means and a phase of the fourth signal obtained at the output of the delay-locked loop,
means of adding signals obtained at the output of the first and second phase comparators,
an attenuator for the signal obtained at the output of the addition means, with a gain of approximately 0.5,
a low-pass filter able to filter the signal obtained at the output of the addition means,
a voltage-controlled delay line comprising a first input connected to an output of the low-pass filter, a second input to which the second signal ref(t+τ) or the third signal ref(t−τ) is intended to be applied, and an output corresponding to the output of the delay-locked loop and coupled to an input of the first phase comparator and to an input of the second phase comparator.

11. The device according to claim 10, in which the output of the voltage-controlled delay line of the delay-locked loop of the second means is directly connected to said inputs of the first and second phase comparators.

12. The device according to claim 1, said device being able to compensate for n delays $\tau_1$ to $\tau_n$ suffered by n first signals $ref_1(t)$ to $ref_n(t)$ during propagation between the first and second ends of the n first transmission connections, n being an integer number greater than or equal to 2, in which the first means able to generate the second signal ref(t+τ), τ being equal to the mean of the n delays $\tau_1$ to $\tau_n$, comprise:
n phase comparators, each being able to compare a phase of one of the n first signals $ref_1(t)$ to $ref_n(t)$ and a phase of a signal obtained at a first end of a second transmission connection able to delay, by a delay substantially equal to τ, a signal propagated on said second transmission connection,
n third transmission connections, each being able to delay, by one of the delays $\tau_1$ to $\tau_n$, a signal propagated on said third transmission connection, comprising a first end connected to an output of one of the n phase comparators and a second end connected to a input of signal addition means,
an attenuator for the signal obtained at the output of the addition means, with a gain equal to approximately 1/n,
a low-pass filter able to filter the signal obtained at the output of the addition means;
a voltage-controlled oscillator an input of which is connected to an output of the low-pass filter and a output of which, corresponding to an output of said first means, is coupled to a second end of the second transmission connection,
said device also comprising at least one phase-locked loop or a delay-locked loop comprising n inputs connected to the second ends of the n first transmission connections and able to deliver the third signal ref(t−τ).

13. The device according to claim 1, said device being able to compensate for n delays $\tau_1$ to $\tau_n$ suffered by n first signals $ref_1(t)$ to $ref_n(t)$ during propagation between the first and second ends of the n first transmission connections, n being an integer number greater than or equal to 2, in which the first means able to generate the second signal ref(t+τ), τ being equal to the mean of the n delays $\tau_1$ to $\tau_n$, comprise:
n phase comparators, each being able to compare a phase of one of the n first signals $ref_1(t)$ to $ref_n(t)$ and a phase of a signal obtained at a first end of a second transmission connection able to delay, by a delay substantially equal to τ, a signal propagated on said second transmission connection,
n third transmission connections, each being able to delay, by one of the delays $\tau_1$ to $\tau_n$, a signal propagated on said third transmission connection, comprising a first end connected to an output of one of the n phase comparators and a second end connected to a input of signal addition means,
an attenuator for the signal obtained at the output of the addition means, with a gain equal to approximately 1/n,
a low-pass filter able to filter the signal obtained at the output of the addition means,
a voltage-controlled delay line comprising a first input connected to an output of the low-pass filter and a second input to which one of the n first signals $ref_1(t)$ to $ref_n(t)$ is intended to be applied, and an output of which, corresponding to an output of said first means is coupled to a second end of the second transmission connection,
said device also comprising at least one phase-locked loop or a delay-locked loop comprising n inputs connected to the second ends of the n first transmission connections and able to deliver the third signal ref(t−τ).

14. A device for distributing at least one clock signal ref(t), comprising several transmission connections on which the clock signal ref(t) or a signal synchronised with the clock signal ref(t) is intended to be propagated, and a plurality of delay compensation devices according to claim 1 coupled to said transmission connections and able to compensate for the propagation times for the signals on said transmission connections.

15. The device according to claim 14, also comprising at least one device for generating the clock signal ref(t).

16. The device according to claim 14, comprising at least one controlled phase loop able to deliver as an output a clock signal the phase of which is synchronised with respect to an average of phases of several signals delivered by said delay compensation devices.

17. The device according to claim 14, also comprising at least two delay compensation devices coupled together so that:
- an output of the first means able to generate a second signal of a first one of the two delay compensation devices is coupled to an input of the second means able to generate a fourth signal of a second one of the two delay compensation devices,
- an output of the first means able to generate a second signal of the second of the two delay compensation devices is coupled to an input of the second means able to generate a fourth signal of the first of the two delay compensation devices.

18. A method for compensating a delay $\tau$ suffered by a first periodic signal ref(t) during propagation between a first and second end of a first transmission connection, comprising at least the steps of:
- generating a second signal ref(t+$\tau$) corresponding to the first signal ref(t) the phase of which is advanced by a time equal to the delay $\tau$,
- generating, from a third signal ref(t−$\tau$) obtained at the second end of the first transmission connection and corresponding to the first signal ref(t) the phase of which is delayed by a delay $\tau$ and from the second signal ref(t+$\tau$), a fourth signal in phase with the first signal ref(t).

* * * * *